United States Patent

MacMullan

[15] 3,639,825

[45] Feb. 1, 1972

[54] NULL-BALANCE SYSTEM WITH ENHANCED NOTCH-TYPE INPUT FILTER

[72] Inventor: Samuel J. MacMullan, Newtown, Pa.

[73] Assignee: Leeds & Northrup Company, Philadelphia, Pa.

[22] Filed: Mar. 13, 1970

[21] Appl. No.: 19,235

[52] U.S. Cl. ................................318/621, 318/619, 318/629

[51] Int. Cl. ..........................................................G05b 6/02

[58] Field of Search..................318/619, 621, 622, 629, 692; 330/21, 31, 107

[56] References Cited

UNITED STATES PATENTS 2,629,077 2/1953 Westfelt.............................318/692 X 3,465,276 9/1969 Silva et al...........................318/621 X

*Primary Examiner*—T. E. Lynch

*Attorney*—Woodcock, Washburn, Kurtz & Mackiewicz

[57] ABSTRACT

A null-balance system having a twin-T input filter, a high-impedance amplifier, and an output circuit having a large time constant. A feedback circuit between the amplifier output and the common terminal of the twin-T filter in combination with an RC circuit connected to the common terminal enhances the frequency response characteristic of the filter signal for null-balance comparison with the input is not affected by the twin-T filter. Another feedback circuit between the output circuit and the common terminal of the twin-T filter provides compensation so that the null-balance feedback circuit between the output circuit and the input of the amplifier provides a signal for null-balance comparison with an unknown input signal.

13 Claims, 4 Drawing Figures

NULL-BALANCE SYSTEM WITH ENHANCED NOTCH-TYPE INPUT FILTER

BACKGROUND OF THE INVENTION

This invention relates to null-balance systems such as null-balance recorders characterized by frequency-selective attenuation of the system input.

In order to achieve this frequency-selective attenuation, a notch-type filter may be used in the input circuit located ahead of an amplifier. Twin-T filters have been found suitable for this purpose and are currently used in certain null-balance recorders for the following reasons. First, the Twin-T filter comprises completely passive circuitry. Second, the Twin-T filter can produce a theoretically infinite rejection or total attenuation at its center frequency, so that practically speaking, the rejection at the center frequency is limited by component tolerances only.

Although null-balance systems employing notch-type filters do produce a substantially ideal rejection at the center frequency, the frequency response characteristic is less than ideal. More particularly, there is a degradation of the system frequency response at frequencies lower than the center frequency of the filter. Furthermore, the use of the notch-type input filter has heretofore substantially altered the unforced dynamic characteristics of the null-balance systems by permitting the notch-type input filter to act upon the null-balance feedback signal. In particular, the use of notch-type input filter has altered the unforced dynamic characteristics which determine stability, damping, and are related to the closed loop frequency response.

The problem associated with the degradation of the frequency response and the alteration of the unforced dynamic characteristics become more pronounced as the balancing speed or bandwidth of the system is increased. Such is the case in a high-speed null-balance recorder. The problems also become more pronounced when widely different source resistances are encountered. In fact, considerable difficulty occurs in the design of recorders with conventional balancing speed and bandwidth where the source resistance is large.

As evident from an article entitled "High-Q-Active Twin-T," by Robert Dobkin, EEE, Sept. 1969, pp. 46 and 47, some progress has been made in obtaining an improved frequency response from a Twin-T filter by a "bootstrapping" technique. Even so, the frequency response may be characterized as having an abrupt increase in attenuation substantially at the center frequency so as to establish a very narrow notch or band of high rejection. This is quite different from the more desirable frequency response characterized by a somewhat less abrupt increase in attenuation approaching the frequency of maximum rejection so as to establish a somewhat broader and flatter rejection band. The Dobkin filter has not therefore been used in a null-balance system such as a recorder where a very narrow notch cannot be tolerated. Furthermore, the Dobkin filter has not been used in such a system because of the difficulty in maintaining unaltered unforced dynamic characteristics of the system.

In null-balance recorders wherein Twin-T filters have been employed, unaltered unforced dynamic characteristics have been achieved only by comprising certain design objectives. In particular, some of these null-balance recorders have been utilized a large resistance placed after the filter and a small resistance comprising a source resistance in an input pad or rheostat adjusted to a known value ahead of the filter. The large resistance and the small resistance are large and small respectively, relative to the series resistance between the input terminal and the output terminal of the Twin-T filter. Larger source resistances can be accommodated without affecting damping only by making the series resistance proportionately larger and the large resistance larger yet. Thus the total resistance in series with the input of the amplifier is determined by the largest source resistance to be accommodated and the attenuation of the input is proportionate to this total resistance. An increase in this total resistance necessitated by large source resistances causes an increase in the noise due to the amplifier.

SUMMARY OF THE INVENTION

It is an object of this invention to obtain an improved frequency response from a null-balance system utilizing an enhanced notch-type filter in the input of a null detecting amplifier having an improved frequency response characteristic for frequencies below the center frequency and a substantially normal frequency response characteristic in the vicinity of the center frequency.

It is also an object of this invention to achieve the foregoing object in a null-balance system having at least one large time constant or lag without altering the unforced dynamic characteristics of the system.

It is also an object to achieve the foregoing objects without substantially increasing noise.

These and other objects may be achieved by providing a filter enhancement circuit coupled to the notch-type filter and a feedback circuit coupled between the output of the null detecting amplifier and the filter enhancement circuit. The filter enhancement circuit includes frequency dependent circuitry so as to operate the filter in a bootstrapped mode for lower frequencies and in an unbootstrapped or conventional mode in the vicinity of the center frequency of the filter. Separate system feedback circuits are provided to the filter enhancement circuit and the input of the null detecting amplifier to achieve compensation so that the input to the filter enhancement circuit is constant when the input signal is constant even though the system feedback signal varies.

DESCRIPTION OF THE PREFERRED EMBODIMENTS

Figure 1:
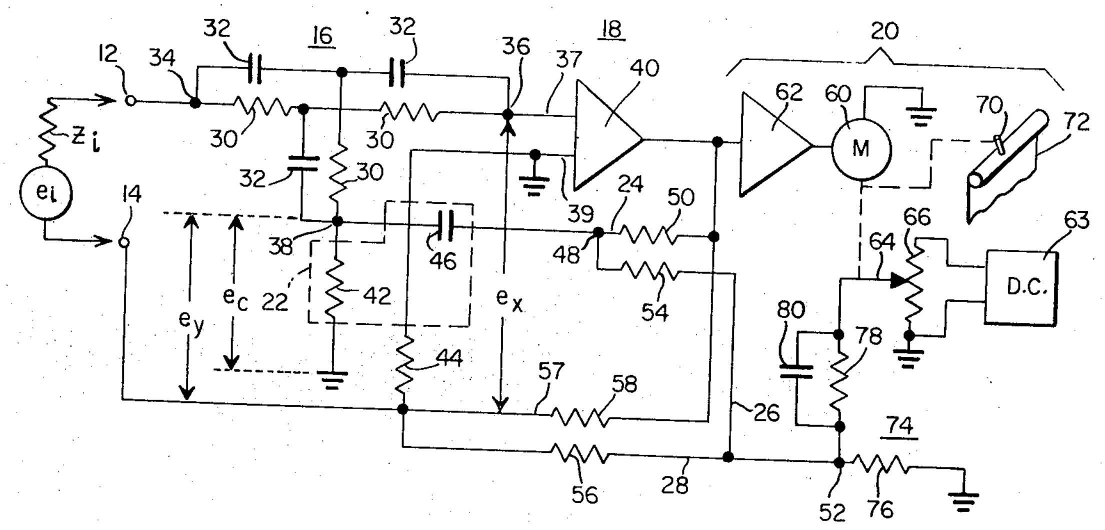
FIG. 1 is a schematic diagram of a null-balance system illustrating one embodiment of the invention.

As shown in FIG. 1, an input signal from a source $E_c$ including an input impedance $Z_i$ is applied between first and second input terminals 12 and 14 of a null-balance system comprising a notch-type input filter circuit 16, a null detecting amplifier circuit 18, and an output circuit 20. In accordance with one aspect of the invention, the frequency response characteristic of the filter circuit 16 is enhanced by a filter enhancement circuit 22 which is responsive to amplifier feedback signals obtained from an amplifier feedback circuit 24. In accordance with another aspect of this invention, system feedback signals from the output circuit 20 are applied to the filter enhancement circuit 22 through a compensating feedback circuit 26 separate from a null-balance feedback circuit 28 so as to provide compensation such that the input to the filter enhancement circuit 22 is constant when the input signal to the system is constant even though the system feedback signal varies.

The input filter circuit 16 comprises a notch-type filter in the form of a conventional Twin-T including resistors 30 and capacitors 32 with an input terminal 34, an output terminal 36, and a common terminal 38. In order to pass the input signal to the input of the amplifier section 18 subject to the filter frequency response characteristic, the filter input terminal 34 is connected to the system input terminal 12 and the filter output terminal is connected to one input terminal 37 of an amplifier 40 with the other input terminal 39 tied to circuit common. In order to enhance this frequency response characteristic, the filter common terminal 38 and the other amplifier terminal 39 which is grounded are connected to the filter enhancement circuit 22 as follows.

The filter enhancement circuit 22 comprises resistive circuitry including a resistor 42 and frequency dependent circuitry including a capacitor 46. The resistor 42 is connected between filter common terminal 38 and circuit common or the amplifier input terminal 39, and the resistor 44 is connected between the amplifier input terminal 39 and the system input terminal 14. By connecting the capacitor 46 between the filter common terminal 38 and a junction 48 of the amplifier feedback circuit 24 and the compensating feedback circuit 26, the combination of the filter circuit 16, the filter enhancing circuit 22, and the amplifier circuit 18 in cooperation with the feedback circuits, will produce an enhanced filter frequency response in the following manner.

For frequencies substantially below the center frequency of the filter's notch which represents the frequency of maximum attenuation in the notch, the filter enhancing circuit 22 operates the Twin-T filter in a bootstrapped mode. In this bootstrapped mode, the amplifier feedback signals carried by the amplifier feedback circuit 24 including a resistor 50 are blocked by the high impedance of the capacitor 46 so as to produce substantially zero voltage across the resistor 42. For frequencies in the vicinity of the center frequency, the amplifier feedback signals are passed by the resulting lower impedance of the capacitor 46 so as to operate the Twin-T filter in a nonbootstrapped or conventional mode.

The compensating feedback circuit 26 which is connected between terminal 52 and the junction 48 comprises a resistor 54 which establishes a feedback path from the output circuit 20 to the filter circuit 16 for compensation. The resistor 42 coacts with the resistor 54 to provide the compensation. The null-balance feedback circuit 28 comprises a resistor 56 connected between the terminal 52 and the system input terminal 14 to establish a feedback path to the amplifier input terminal 39 of the amplifier 40 through the resistor 44 which is separate from the feedback path of the compensating feedback circuit. By doing so, the null-balance feedback signal is not operated upon by the Twin-T filter as described subsequently.

An additional feedback circuit 57 is provided in the null-balance system so as to provide a high input impedance for the amplifier 40. In this connection, a resistor 58 is connected to the output of the amplifier 40 and the second system input terminal 14 to provide a voltage-to-voltae feedback path. This feedback path determines the gain of the amplifier 40.

The large time constant of the output circuit 20 is provided by a balancing motor 60 which is driven by the power amplifier 62. The output of the motor 60 is coupled to a slidewire contact 64 which, in combination with a slidewire 66 and a suitable stable DC power supply 68 such as a battery provides system feedback signal. By providing a pen 70 coupled to the drive shaft of the motor 60 and a recorder chart 72, the null-balance system may be used to great advantage in a recording apparatus.

The system feedback signal at the slidewire contact 64 is then coupled to the terminal 52 through a proportional plus derivative circuit 74 comprising resistors 76, 78, and a capacitor 80. Particularly in the recorder art, a circuit such as the circuit 74 which provides a derivative component is usually necessary to obtain the desired unforced dynamic characteristic.

Figure 2:
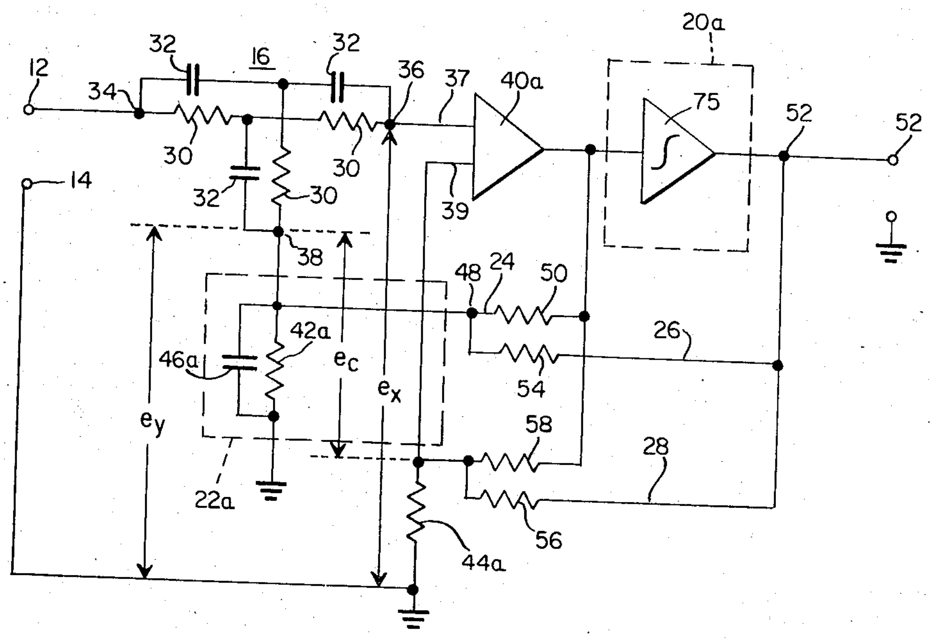
FIG. 2 is a schematic diagram of a null-balance system illustrating another embodiment of the invention.

In the embodiment of FIG. 2, an amplifier 40*a* having a differential input is utilized in combination with another filter enhancement circuit 22*a*. In this embodiment, the frequency dependent circuitry comprises a capacitor 46*a* which is connected in shunt with a resistor 42*a* between the common terminal 38 of the Twin-T filter and the reference terminal 14 at circuit common. For low frequencies, the capacitor 46*a* is an open circuit and the Twin-T filter is operated in a bootstrapped mode. For frequencies in the vicinity of the center frequency of the Twin -T filter, the capacitor 46*a* has a reduced impedance to effectively short circuit the resistor 42*a* and operate the Twin-T filter in a substantially unbootstrapped or substantially conventional mode. The embodiment of FIG. 2 also comprises an amplifier with a large time constant. However, the output circuit 20*a* in FIG. 2 is shown as comprising an integrating amplifier 75 rather than the motor controlled arrangement in the output circuit 20 of FIG. 1 although the null-balance system of FIG. 2 may also be used to great advantage with the output circuit 20.

Figure 3:
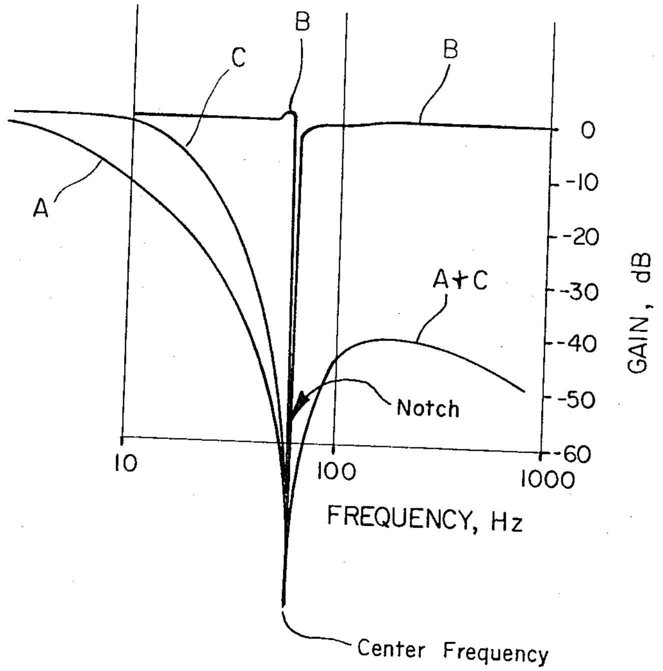
FIG. 3 is a graphical diagram representing frequency response characteristics of notch-type filters for demonstrating one aspect of null-balance systems embodying the invention.

In the foregoing, reference has been made to the operation of the Twin-T filter in bootstrapped and nonbootstrapped or conventional modes. Reference will now be made to FIG. 3 in order to provide a better understanding of what bootstrapped and conventional modes mean in terms of filter frequency response characteristics. In the diagram of FIG. 3, the logarithmic abscissa represents frequency and the ordinant represent gain, dB as indicated. When the Twin-T filter operates in a conventional mode, the frequency response characteristic A rolls off gently to a broad notch at the interference frequencies with the center of the notch located at the center frequency. When the Twin-T filter is bootstrapped, the frequency response characteristic B forms a very narrow notch with an amplifier having high gain representing a rather abrupt increase in attenuation. When the frequency response characteristic of the Twin-T filter is enhanced as in the systems of FIGS. 1 and 2, the Twin-T filter operates in a substantially bootstrapped mode over the lower frequencies and operates in the substantially conventional mode in the vicinity of the center frequency so as to provide a broader, flatter notch in the characteristic in the vicinity of the center frequency. With this enhanced characteristic of the Twin-T filter, the overall frequency response of the system is improved in accordance with one object of the invention. Of course, broader and flatter are relative terms used in reference to the very narrow notch of the high gain, bootstrapped mode as shown.

Figure 4:
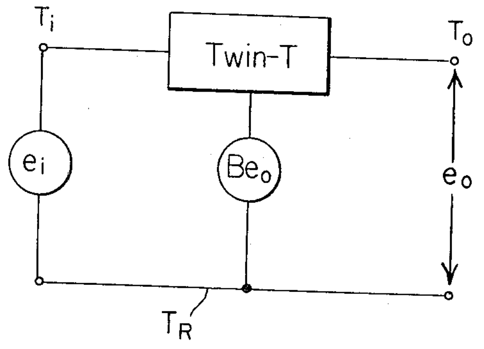
FIG. 4 is a schematic diagram of an equivalent circuit for a filter for use in defining terms employed in the specification and the claims.

The meaning of bootstrapped or conventional modes of operation for the Twin-T filter from a circuit standpoint will now be discussed with reference to FIG. 4. As shown there in equivalent circuit form, a Twin-T or other notch-type filter is driven by an input signal source $e_i$ between an input terminal $T_i$ and a reference terminal $T_r$ to generate an output signal $e_o$ between the output terminal $T_o$ and the reference terminal $T_r$. A feedback signal $BE_o$ is also generated between a common terminal of the Twin-T or other notch-type filter and the reference terminal $T_r$. By definition, the Twin-T or other notch-type, filter is operated in the bootstrapped mode when $B=1$. Also by definition, the Twin-T filter is operated in the non-bootstrapped or conventional mode when $B=0$.

Accordingly, the filter 16 of FIG. 1 operates in a bootstrapped mode when $E_c=0$ and $E_y=E_x$ and operates in a conventional mode when $E_y=0$ and $E_c=E_x$. The filter 16 of FIG. 2 operates in a bootstrapped mode when $E_c=0$ and $E_x=E_y$ and operates in a conventional mode when $E_y=0$ and $E_c=E_x$.

When the above described null-balance systems are operated as follows, the bootstrapped notch-type filters of the filter circuit 16, which have a bootstrapped frequency response characteristic of abruptly increasing attenuation as the frequency increases toward the center frequency of the filter, may be modified so as to achieve an enhanced characteristic of more gradually increasing attenuation as the frequency increases toward the center frequency. As a result, a notch is obtained in the enhanced characteristic which is substantially broader and flatter than the notch of the bootstrapped characteristic.

Describing the operation of FIG. 1 first, a null-balance system feedback signal is derived from the slidewire contact 64 and applied to the input of the amplifier 40 through feedback circuitry comprising resistors 44, 56, and 58. A signal derived from the output of the amplifier 40, which varies with the frequency components applied to the input of the amplifier 40, is applied to the filter common terminal 38 through feedback circuitry comprising resistors 42, 50, and 54 and the capacitor 46. A compensating system feedback signal is also derived from the slidewire contact 64. The compensating system feedback signal, which varies with frequency components applied to the input of the amplifier 40, is applied to the filter common terminal 38 so as to compensate for the frequency components which are independent of the components in the input signal applied between the input terminals 12 and 14. Finally, an amplifier feedback signal is derived from the output of the amplifier 40 and applied to the input of the amplifier 40 through feedback circuitry comprising resistors 56, 58 and 44. The signal representative of the output of the amplifier 40 which varies with the frequency components applied to the input of the amplifier 40 and the compensating system feedback signal are summed before application to the filter common terminal 38. The null-balance system feedback signal and the amplifier feedback signal for achieving a high input impedance for the amplifier are also summed before application to the input of the amplifier 40 at a terminal 14.

The null-balance system of FIG. 2 operates substantially the same way only the feedback circuits are as follows. The signal representative of the output of the amplifier which varies with the frequency component applied to the input of the amplifier is applied through a feedback circuitry comprising the resistors 42a, 50 and the capacitor 46a. The compensating system feedback signal is applied through a feedback circuitry comprising the resistors 50, 42a and 54 and a capacitor 46a. The null-balance system feedback signal is applied through feedback circuitry comprising resistor 44a and 56 while the amplifier feedback signal for achieving high input impedance for the amplifier is applied through feedback circuitry comprising resistors 44a and 58.

Throughout the specification I have referred to a large time constant which is characteristic of the null-balance system output means. The large time constant is only one kind of lag that can be exhibited by the output means. The lag in the response of the output means may also be due to small bandwidth or nonlinearities. For example, the rate of change of the output may be constrained such as when slew rate limiting occurs in an amplifier system. On the other hand, the acceleration may be limited, as in a servosystem with motor current limiting. Another example of nonlinearity is that due to amplifier saturation.

The present invention is particularly useful in null-balancing systems utilized in the electrical measuring art, particularly in systems in which a pen is driven relative to a scale and/or chart for indicating magnitudes of system variables such as temperature or other physical, chemical or electrical conditions. In systems of this kind, the input signal may, for periods of time, have direct current characteristics. At other times, the signal variations will have a relatively wide range of frequency components including but not limited to 60 Hz. Accordingly, FIG. 3 illustrates rejection at a characteristic frequency response with a notch at 60 Hz. Since electrical measuring instruments are utilized in power generating stations and in environments where motors of substantial size are operated, the spurious signals introduced into the measuring system by stray magnetic fields of fairly large intensity require filtering to eliminate the effects in the measuring circuit of the spurious signals.

Examples of a few typical systems to which the present invention is particularly applicable will be found in Williams U.S. Pats. No. 2,113,164, 2,367,746 and McAdam et al. U.S. Pat. No. 3,045,155 and No. 3,267,374.

While it has been found that the invention may be utilized to great advantage in a null-balance recorder system, particularly a high-speed null-balance recorder system, it should be understood that the invention may be embodied in a null-balance integrating amplifier system and other systems which will occur to one of ordinary skill in the art. Accordingly, it will be understood that the invention comprehends various modifications and equivalents of these systems within the scope of the appended claims.

What is claimed:

1. A null-balance system responsive to an input signal comprising:

a notch-type input filter means characterized by substantial rejection at the center frequency of the notch, the input signal being applied to the input of said input filter means;

a null detecting amplifier means coupled to the output of said input filter means;

a filter enhancement means coupled to said input filter means and the input of said amplifier means for operating said notch-type filter means in a substantially bootstrapped mode for frequencies lower than the center frequency and operating said filter means in a substantially conventional mode in the vicinity of said center frequency;

output means coupled to the output of said amplifier, the state of said output means being responsive to the output of said amplifier;

an amplifier feedback means for coupling a signal representing the output of said amplifier means to said filter enhancement means for determining the mode of operation of said filter means as a function of frequency;

a first system feedback means coupling said system feedback signal representing the state of said output means to the input of said amplifier means to obtain a null-balance feedback signal; and a second system feedback means coupling said system feedback signal from said output means to said filter enhancement means for compensation such that the input to said filter enhancement means is constant when the input signal is constant even though said system feedback signal varies.

2. The null-balance system of claim 1 wherein:

said filter enhancement means comprises an RC circuit to provide frequency dependent enhancement of said input filter means.

3. The null-balance system of claim 2 wherein;

said input filter means comprises a Twin-T filter having an input terminal, an output terminal, and a common terminal, said input signal being applied to said filter input terminal, said output terminal being connected to the input of said amplifier, and said common terminal being connected to said filter enhancement means.

4. The null-balance system of claim 3 wherein:

said amplifier means has a single ended input; and said RC circuit comprises a resistor connected between said filter common terminal and circuit common, and a capacitor connected between said filter common terminal and both said amplifier feedback means and said second system feedback means, said capacitor acting as a low impedance in the vicinity of the filter center frequency.

5. The null-balance system of claim 3 wherein:

said amplifier means has a differential input; and said RC circuit comprises one resistor connected between said filter common terminal and circuit common, and a capacitor connected in shunt with said one resistor acting as a short circuit in the vicinity of the filter center frequency.

6. A null-balance system responsive to an input signal applied between first and second system input terminals and characterized by at least one large time constant in the null balance loop, said system comprising:

a Twin-T filter circuit having an input terminal, output terminal, and a common terminal, said filter input terminal coupled to said first system input terminal;

a null detecting amplifier circuit having an input terminal and an output terminal, one of said pair of amplifier input terminals coupled to said filter output terminal;

an output circuit having an input coupled to the amplifier output;

a filter-enhancing circuit comprising a resistive circuit connected between said filter common terminal and circuit common and a frequency dependent circuit connected to said filter common terminal, said filter enhancing circuit enhancing the frequency response characteristic of said Twin-T filter at frequencies lower than the center frequency of said filter circuit;

an amplifier feedback circuit coupled between said output terminal of said amplifier and said frequency dependent circuit to control said filter enhancing circuit;

a compensation feedback circuit coupling a system feedback signal to said frequency dependent circuit; and a null-balance feedback circuit coupling a system feedback signal from said output means and an ungrounded terminal of said resistive means such that the null-balancing feedback signal applied to said other of said input terminals of said amplifier circuit is not operated on by said Twin-T filter.

7. The null-balance system of claim 6 wherein:

said amplifier circuit includes a voltage-to-voltage feedback circuit to establish a high impedance for said amplifier circuit.

8. The null-balance system of claim 7 wherein:

said amplifier feedback circuit, said compensation feedback circuit, said null-balance feedback circuit, and said voltage-to-voltage feedback circuit are substantially resistive.

9. The null-balance system of claim 8 wherein:

said output circuit comprises a motor and an adjustable circuit element coupled to said motor and responsive to the unbalance of the system at said null-detecting amplifier circuit.

10. In a null-balance system comprising a null-detecting amplifier having an output circuit and an input circuit including a notch-type filter having a bootstrapped frequency response characteristic of abruptly increasing attenuation as the frequency increases toward the center frequency of the filter, the method of modifying the bootstrapped characteristic of the notch-type filter to obtain an enhanced characteristic of more gradually increasing attenuation as the frequency increases toward the center frequency comprising the steps of:

deriving a null-balance system feedback signal;

applying said null-balance system feedback signal to the input of the amplifier;

deriving a signal representative of the output of the amplifier which varies with the frequency components applied to the input of the amplifier;

applying said signal representative of the output of said amplifier to the notch-type filter to obtain a more gradual increase in attenuation;

deriving a compensating feedback signal from the output of system which varies with frequency components applied to the input of the amplifier; and applying said compensating feedback signal to said notch-type filter so as to compensate for frequency components which are independent of the frequency components in the input to the system.

11. The method of claim 10 wherein:

said signal representing the output of the amplifier and said compensating feedback signal are summed before application to said notch-type filter.

12. The method of claim 11 further comprising the steps of:

deriving an amplifier feedback signal from the output of the amplifier; and applying the amplifier feedback signal to the input of the amplifier to achieve a high input impedance for the amplifier.

13. The method of claim 12 wherein said amplifier feedback signal and said null-balance feedback signal are summed before application to the input of the amplifier.

* * * * *